(12) United States Patent
Graves et al.

(10) Patent No.: US 11,735,281 B2
(45) Date of Patent: Aug. 22, 2023

(54) ANALOG CONTENT ADDRESSABLE MEMORY WITH ANALOG INPUT AND ANALOG OUTPUT

(71) Applicant: HEWLETT PACKARD ENTERPRISE DEVELOPMENT LP, Houston, TX (US)

(72) Inventors: Catherine Graves, Milpitas, CA (US); Can Li, Palo Alto, CA (US); John Paul Strachan, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 64 days.

(21) Appl. No.: 17/245,540

(22) Filed: Apr. 30, 2021

(65) Prior Publication Data
US 2022/0351794 A1 Nov. 3, 2022

(51) Int. Cl.
*G11C 27/00* (2006.01)
*G11C 15/04* (2006.01)

(52) U.S. Cl.
CPC .......... *G11C 27/005* (2013.01); *G11C 15/046* (2013.01)

(58) Field of Classification Search
None
See application file for complete search history.

(56) References Cited

U.S. PATENT DOCUMENTS

| | | | | |
|---|---|---|---|---|
| 5,592,418 | A * | 1/1997 | Sabatini | ............ H01L 29/7881 257/E29.302 |
| 6,618,281 | B1 * | 9/2003 | Gordon | ................. G11C 15/00 365/189.07 |
| 6,975,526 | B2 | 12/2005 | Regev et al. | |
| 6,985,372 | B1 | 1/2006 | Blyth et al. | |
| 2002/0038295 | A1 * | 3/2002 | Navoni | ............ G06F 16/90344 |
| 2002/0090117 | A1 * | 7/2002 | Kramer | ................. G06V 40/40 382/124 |

(Continued)

FOREIGN PATENT DOCUMENTS

EP 0276070 A2 7/1988

OTHER PUBLICATIONS

Kramer et al. "Ultra-low-power analog associative memory core using flash-EEPROM-based programmable capacitors" ISLPED '95: Proceedings of the 1995 international symposium on Low power design (Apr. 1995) pp. 203-208 (https://doi.org/10.1145/224081.224117). (Year: 1995).*

(Continued)

*Primary Examiner* — J. H. Hur
(74) *Attorney, Agent, or Firm* — Sheppard Mullin Richter & Hampton LLP

(57) ABSTRACT

An analog content addressable memory (aCAM) that enables parallel searching of analog ranges of values and generates analog outputs that quantify matches between input data and stored data is disclosed. The input data can be compared with the stored data, and the input data can be determined to match the stored data based on a value associated with the input data being within a range associated with the stored data. The aCAM can generate an analog output that represents a number of matches and a number of mismatches between the input data and the stored data. Based on the analog output, whether the input data matches the stored data and a degree to which the input data matches the stored data can be determined.

17 Claims, 9 Drawing Sheets

(56) References Cited

U.S. PATENT DOCUMENTS

2015/0347896 A1* 12/2015 Roy ................ H03K 3/356104
706/29
2020/0258587 A1* 8/2020 Li ........................ G11C 15/046

OTHER PUBLICATIONS

Li, C. et al., "Analog Content-addressable Memories with Memristors," Nature Communications, Apr. 2, 2020, 9 pgs., https://www.nature.com/articles/s41467-020-15254-4, Springer Nature.

Yin, X. et al., "FeCAM: A Universal Compact Digital and Analog Content Addressable Memory Using Ferroelectric," IEEE Transactions on Electron Devices, Jul. 2020, pp. 2785-2792, vol. 67, No. 7, website accessed Jan. 27, 2021, https://www.semanticscholar.org/paper/FeCAM%3A-A-Universal-Compact-Digital-and-Analog-Using-Yin-Li/f09918857145b69666df8363f8563fa4df56a4d6, IEEE.

* cited by examiner

ANALOG CONTENT ADDRESSABLE MEMORY WITH ANALOG INPUT AND ANALOG OUTPUT

DESCRIPTION OF RELATED ART

A content addressable memory ("CAM") is a type of computer memory in which stored data is accessed based on its contents rather than its address. In this way, CAM can be differentiated from other types of computer memory, such as random access memory ("RAM"), in which stored data is accessed based on its address. In general, CAM is faster than RAM and other types of computer memory in search applications and are often used in various technologies such as computer networking technologies. In computer networking technologies, CAM is often used, for example, in forwarding operations, routing operations, and cache memory applications. CAM has a wide range of applications in computer technology. Thus, improvements to CAM provide for improvements to computer technology.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1A:
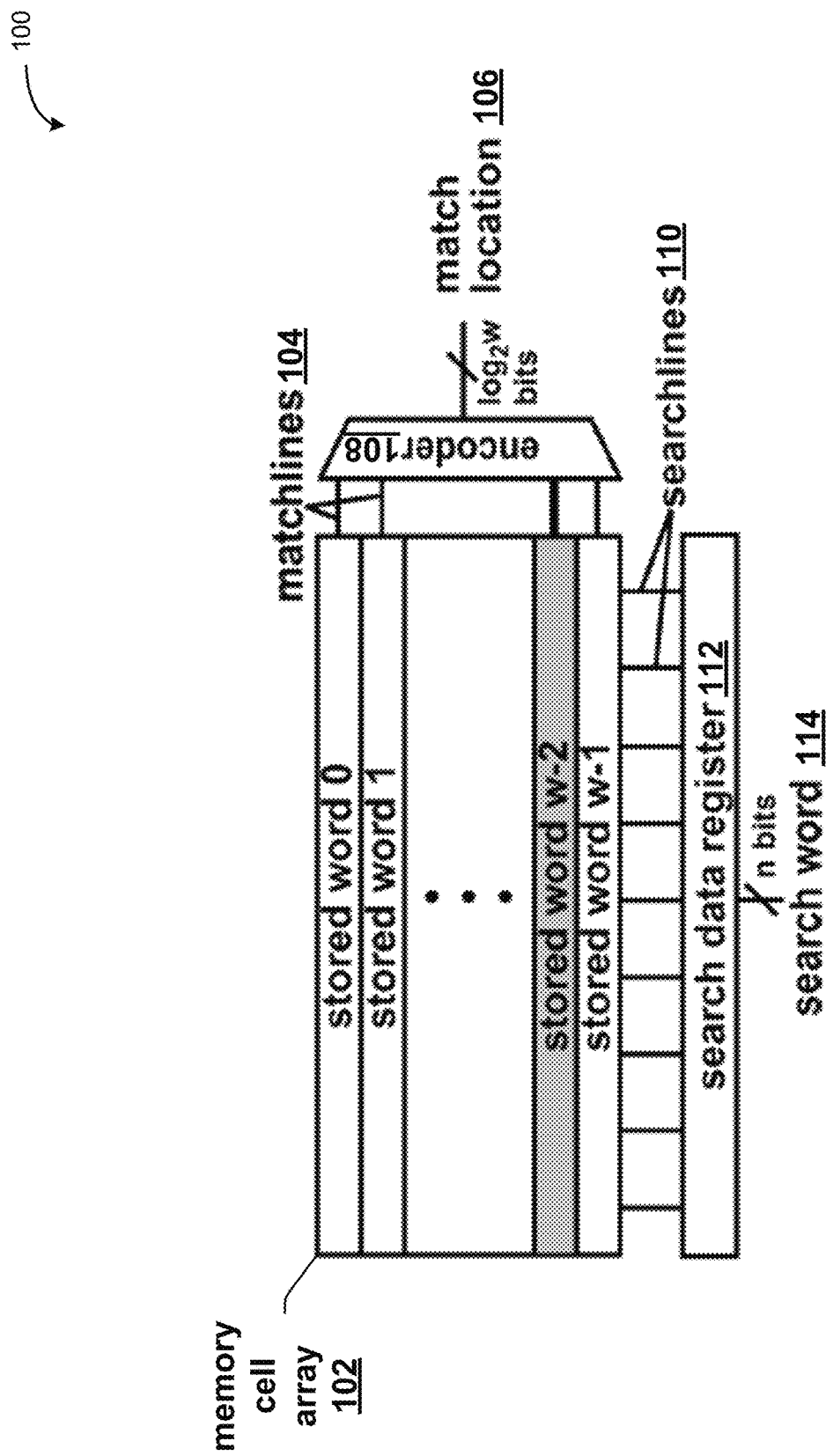
FIG. 1A depicts a block diagram of an example content addressable memory (CAM) in accordance with various embodiments.

The figures are not exhaustive and do not limit the present disclosure to the precise form disclosed.

DETAILED DESCRIPTION

One way in which content addressable memory (CAM) offers faster performance in search applications is by performing search operations on its memory in parallel. When an input (e.g., input search word) is provided to CAMs, the CAMs performs the search for the input in its memory in parallel. The input is compared with stored data in the CAMs, and the address of the stored data that matches the input is returned. Because the search for the input is performed in parallel, a search system based on CAMs can perform search operations faster than, for example, an iterative search system that iteratively searches its memory.

While CAMs provide various advantages over other types of computer memory, the use of CAMs involve various technological challenges. Some of these technological challenges involves the use of digital CAMs, such as binary CAMs (BCAMs) and ternary CAMs (TCAMs). In general, BCAMs accept binary inputs of "0"s and "1"s and perform exact match searches of the binary inputs. TCAMs accept binary inputs like BCAMs and an additional "x" or "don't care" input. Similar to BCAMs, TCAMs perform exact match searches with the additional "x" or "don't care" input returning a match regardless of whether the corresponding bit is a "0" or a "1". Because digital CAMs, such as BCAMs and TCAMs, rely on exact match searches, systems that rely on digital CAMs face various technological challenges. These technological challenges include, for example, performing a search for a range of acceptable matches, such as in a fuzzy search application, or, for example, determining a degree to which an input matches a stored data in memory (e.g., Hamming distance).

Accordingly, disclosed is analog content addressable memory (aCAM) that addresses the various technological challenges described herein. In various embodiments, an aCAM enables parallel searching of analog ranges of values and generates analog outputs that quantify matches between input data (e.g., input search words) and stored data (e.g., stored words). An input search word can include one or more input search values. A stored word can include one or more stored values or, in some cases, stored ranges of values. In an example embodiment, an aCAM may include a set of memory cells arranged on a match line. The memory cells of the aCAM may be used to represent a stored word. Each memory cell of the aCAM can represent a stored value or a stored range of values of the stored word. As further described herein, an analog signal (e.g., analog input) can be a signal that includes a continuous range of time-varying values. This is in contrast to, for example, a binary digital signal that includes discrete 0 and 1 values. In an example embodiment, a memory cell of an aCAM can represent a stored range of values of a stored word. The memory cell can include two memristors that determine the stored range of values of the stored word. Conductances of the two memristors may be tuned to represent a lower voltage bound and an upper voltage bound of an analog voltage range for the memory cell. The upper voltage range and the lower voltage range can represent the stored range of values of the stored word. In an example embodiment, an input search word can be provided through a match line of an aCAM that represents a stored word. A voltage associated with an input search value of the input search word can be received at a memory cell of the aCAM through the match line. The input search value can be compared with a stored range of values represented by the memory cell based on a voltage of the input search value and an analog voltage range for the memory cell. The input search value can be determined to match the stored range of values based on the voltage being within the analog voltage range for the memory cell. The input search value can be determined to not match the stored range of values based on the voltage being outside the analog voltage range for the memory cell. In this way, input search values of the input search word can be compared with memory cells representing stored ranges of values of the stored word. The aCAM can generate an analog output that represents a number of matches between the input search values of the input search word and the stored ranges of values of the stored word. Based on the analog output, whether the input search word matches the stored word and a degree to which the input search word matches the stored word (e.g., Hamming distance) can be determined. As illustrated in this example embodiment, an aCAM can be configured to receive an analog input and generate an analog output indicative of a match between the analog input and a stored data and indicative of a degree to which the analog input and the stored data match, as further described herein.

FIG. 1A depicts a block diagram of an example content addressable memory (CAM) 100 in accordance with various embodiments. In some cases, the CAM 100 may be used in a digital application in which a digital input search word is provided to the CAM 100 and a digital output indicative of a match between the digital input search word and a digital stored word. In some cases, the CAM 100 may be used in an analog application in which an analog input search word is provided to the CAM 100 and an analog output indicative of a match between the analog input search word and an analog stored word and indicative of a degree to which the analog input search word and the analog stored word match. As illustrated in FIG. 1A, the CAM 100 can include a memory cell array 102. The memory cell array 102 stores stored words 0 through 2-1. Each stored word in the memory cell array 102 includes one or more stored values. In some cases, the stored values can be analog stored values or a range of stored values. The CAM 100 can include a search data register 112. The search data register 112 may be loaded with a search word 114. The search word 114 can be a digital input search word or an analog input search word. The search word 114 can include n bits. When performing a search, the search word 114 is loaded into the search data register 112 and communicated to the memory cell array 102 through a set of search lines 110. The input search word is searched among the stored words of the memory cell array 102. Each memory cell in the memory cell array 102 can indicate whether a value of the search word 114 matches a stored value in the memory cell. In some cases, a memory cell in the memory cell array 102 can indicate whether an analog value of the search word 114 matches a stored analog value or is within a stored analog range in the memory cell. The indications of whether the memory cells in the memory cell array 102 contain matches with the search word 114 is communicated to an encoder 108 through a set of match lines 104. When performing a search, a match line can be charged to a threshold voltage. The match line discharges for each mismatch indicated by memory cells on the match line. Based on the matches or mismatches communicated through the set of match lines 104, the encoder 108 outputs a match location 106. The match location 106 can indicate an address or a location associated with a stored word that matches the search word 114.

Figure 1B:
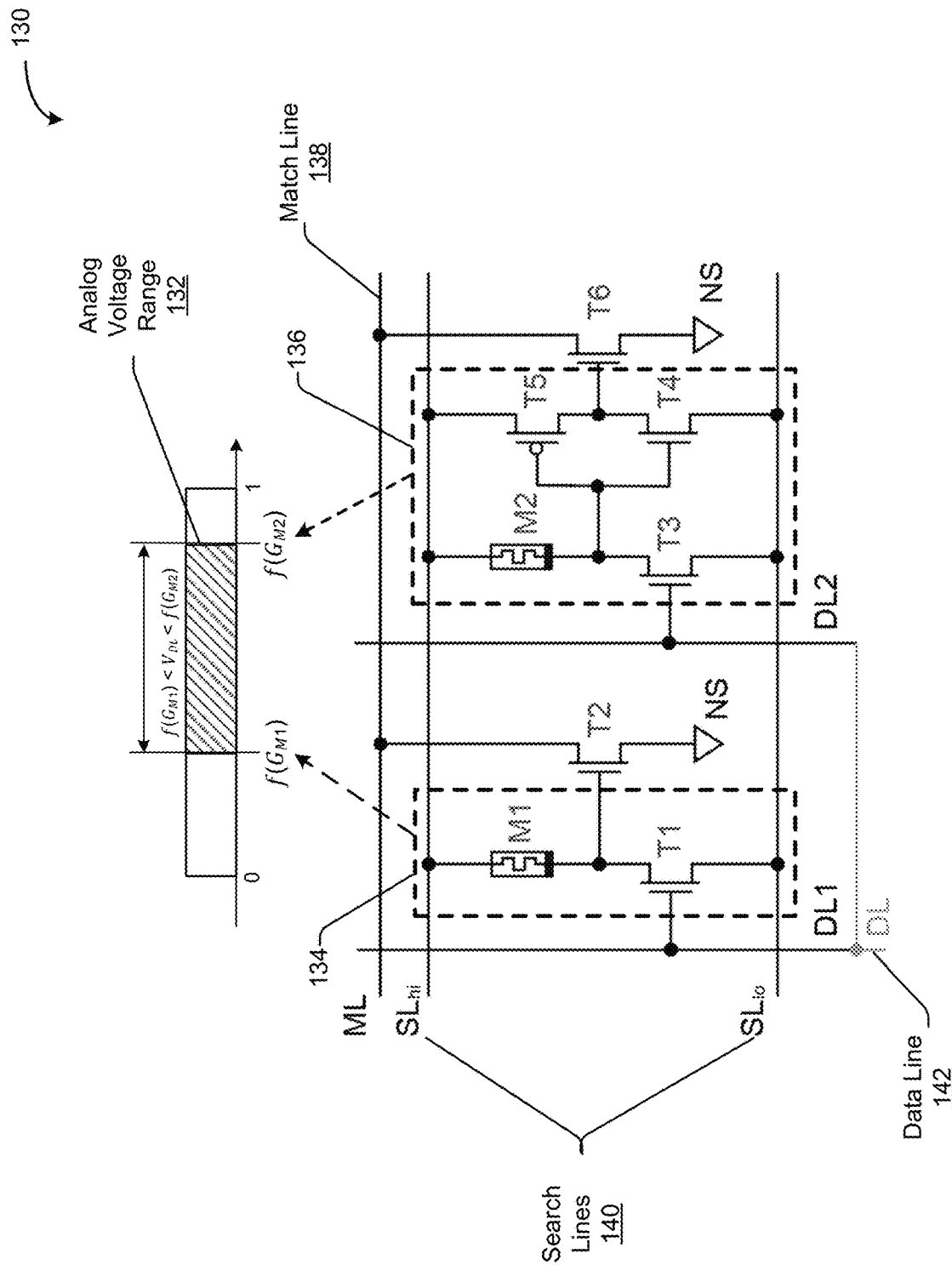
FIG. 1B is a diagram of an example analog content addressable memory (aCAM) cell configured to store an analog range of values in accordance with various embodiments.

FIG. 1B is a diagram of an example analog content addressable memory (aCAM) cell 130 configured to store an analog range of values in accordance with various embodiments. As illustrated in FIG. 1B, the aCAM cell 130 includes six transistors (T1-T6) and two memristors (M1-M2). The transistors may include various combinations of n-type and p-type transistors. As a non-limiting example, the transistors may include five n-type metal oxide semiconductor (MOS) field-effect transistors (MOSFETs) and one p-type MOSFET. Other types of transistors employing a variety of types of semiconductor materials may be used. In various embodiments, an input search value is mapped to a voltage amplitude $V_{DL}$ that is applied along a data line 142. The data line 142 may also be connected to other aCAM cells. The aCAM cells on the data line 142 may store values or ranges of values associated with different stored words. The voltage $V_D$ along the data line 142 is divided into voltages $V_{DL1}$ and $V_{DL2}$ and provided to the divider sub-circuits 136, 138. The aCAM cell 130 can store an upper bound value and a lower bound value for matching against the input search value. The upper bound value can correspond to a conductance $G_{M1}$ of the memristor M1, and the lower bound value can correspond a conductance $G_{M2}$ of the memristor M2. The conductances $G_{M3}$ and $G_{M2}$ establish a lower voltage bound f $(G_{M1})$ and an upper voltage bound f $(G_{M2})$ of an analog voltage range 132 that represents a continuous analog range of values stored in the aCAM cell 130. In other words, the lower bound value of the analog range of values stored in the aCAM cell 130 corresponds with the lower voltage bound established by the conductance $G_{M1}$ of memristor M1, and the upper bound value of the analog range of values stored in the aCAM cell 130 corresponds with the upper voltage bound established by the conductance $G_{M2}$ of memristor M2.

As illustrated in FIG. 1B, the aCAM cell 130 can be connected to a match line 138. The aCAM cell 130 can be connected with other aCAM cells on the match line 138. The aCAM cells on the match line 138 may store values or ranges of values associated with a stored word. In various embodiments, a search operation may begin by pre-charging the match line 138 to a high logic level (e.g., a high voltage). The match line 138 remains at the high voltage (which indicates a match) if all of the aCAM cells connected to the match line 138 match their corresponding input values. If a search input value does not match a stored value in a corresponding aCAM cell, the cell may discharge the match line 138, leading to a low logic level on the match line 138. The low logic level on the match line 138 can be indicative of a mismatch.

In various embodiments, a lower voltage bound and an upper voltage bound are encoded by the voltage divider sub-circuits 134, 136. The voltage divider sub-circuits 134, 136 determine the gate voltages of pull-down transistors T2 and T6, which are connected to the match line 138. The voltage divider sub-circuit 134 includes a transistor T1 and a memristor M1 connected in series, which control a gate voltage G1 of the pull-down transistor T2 that corresponds with a lower bound match threshold of the aCAM cell 130. The upper bound match threshold of the aCAM cell 130 is configured similarly with an independent voltage divider sub-circuit 136 that includes a transistor T3 and a memristor M2 connected in series as well as an inverter (transistors T4 and T5 operate as an inverter) to control a gate voltage G2 of the pull-down transistor T6.

The match line 138 is connected to pull-down transistors T2 and T6, and is kept high for a match result when both the gate voltage G1 of the pull-down transistor T2 is smaller than the threshold voltage of T2 and the gate voltage G2 of the pull-down transistor T6 is smaller than the threshold voltage of T6, keeping both transistors T2 and T6 in a high resistance (e.g., OFF) state. If $V_{DL1}$ is larger than a threshold voltage of transistor T1, the transistor T1 is highly conductive. As a result, the search voltage between search lines 140 (e.g., $SL_{high}$ and $SL_{low}$) will drop across the memristor M1, resulting in a small gate voltage G1 on transistor T2 that is less than a threshold voltage of T2 and insufficient to turn on the pull-down transistor T2. Because T2 does not turn on, it does not discharge the match line 138. If $V_{DL1}$ is smaller than the threshold voltage of transistor T1, then T1 remains in a high resistance, non-conductive state. As a result, the search voltage between search lines 140 (e.g., $SL_{high}$ and $SL_{low}$) will drop across transistor T1 and memristor M1, causing a gate voltage G1 on transistor T2 that is larger than the threshold voltage of T2, thereby turning on the pull-down transistor T2 and leading to the discharge of the match line 138. The divider sub-circuit 134 enforces the lower bound of the stored range in the aCAM cell 130 by discharging the match line 138 (thereby indicating a mismatch) for a $V_{DL}$ that is less than (or less than or equal to) the lower voltage bound $f(G_{M1})$ established by the conductance $G_{M1}$ of the memristor M1. The divider sub-circuit 214 enforces the upper bound of the stored range in the aCAM cell 130 by discharging the match line 138 (e.g., indicating a mismatch) for a $V_{DL}$ that is greater than (or greater than or equal to) the upper voltage bound $f(G_{M2})$ established by the conductance $G_{M2}$ of the memristor M2. If $V_{DL2}$ is less than a threshold voltage of transistor T3, then T3 remains in a high resistance, non-conductive state. As a result, the search voltage between search lines 140 will drop across transistor T3 as well as memristor M2, causing a high voltage to be supplied to the inverter (transistors T4 and T5 together). The inverter inverts the high voltage causing a low gate voltage G2 to be applied to the pull-down transistor T6. This low gate voltage G2 is smaller than the threshold voltage of T6, and thus, insufficient to turn on the transistor T6. Because T6 does not turn on, it does not discharge the match line 138. If $V_{DL2}$ is larger than the threshold voltage of transistor T3, then transistor T3 turns on and remains in a highly conductive state. As a result, the search voltage between search lines 140 will drop across the memristor M2, resulting in a small voltage being supplied to the inverter. The inverter inverts this small voltage to a high gate voltage G2 that is larger than the threshold voltage of pull-down transistor T6, thereby turning on transistor T6 and causing it to discharge the match line 138.

Thus, the aCAM cell 130 keeps the match line 138 high when $V_{DL}$ is within a certain range as defined by the conductance $G_{M1}$ of memristor M1 and the conductance $G_{M2}$ of memristor M2, or when $f(G_{M1}) < V_{DL} < f(G_{M2})$. In various embodiments, the match line 138 may be kept high if $f(G_{M1}) = V_{DL}$ or $V_{DL} = f(G_{M2})$. Thus, the analog voltage range 132 bounded by $f(G_{M1})$ and $f(G_{M2})$ is a matching voltage range for the aCAM cell 130. In other words, the aCAM cell 130 determines that a search input value matches the range of values stored in the aCAM cell 130 if the voltage ($V_{DL}$) to which the search input value is mapped is within the analog voltage range 132 bounded by $f(G_{M1})$ and $f(G_{M2})$. Different analog ranges of values may be stored in different aCAM cells by tuning one or more of the conductances $G_{M1}$ and $G_{M2}$ of the memristors M1 and M2.

In various embodiments, the aCAM cell 130 is configurable to store a "don't care" value. Thus, the aCAM cell 130 is capable of operating as a TCAM cell. The aCAM cell 130 may be configured to store a "don't care" value by tuning the conductance $G_{M1}$ of memristor M1 and the conductance $G_{M2}$ of memristor M2 such that $f(G_{M1}) \le V_{DL,min}$ and $f(G_{M2}) \ge V_{DL,max}$. If the conductance $G_{M1}$ of memristor M1 is tuned such that the lower voltage bound $f(G_{M1})$ is below the minimum voltage that can be applied to the data line 142 (e.g., $V_{DL,min}$) and the conductance $G_{M2}$ of memristor M2 is tuned such that the upper voltage bound $f(G_{M1})$ is above the maximum voltage that can be applied to the data line 142 (e.g., $V_{DL,max}$), then any voltage $V_{DL}$ capable of being applied to the data line 142, which is bounded by $V_{DL,min}$ and $V_{DL,max}$, would also fall within the analog voltage range 132 bounded by $f(G_{M1})$ and $f(G_{M2})$. Thus, the lower voltage bound $f(G_{M1})$ and the upper voltage bound $f(G_{M2})$ encompasses the range bounded by $V_{DL,min}$ and $V_{DL,max}$. Thus, for a search input value, the voltage $V_{DL}$ to which the search input value is mapped would be within the analog voltage range 132 bounded by $f(G_{M1})$ and $f(G_{M2})$. This allows the aCAM cell 130 to match any search input value—the equivalent of storing a "don't care" value.

The aCAM cell 130 may be configured to support receiving a "don't care" value for a search input value. In various embodiments, a "don't care" value can be searched by applying different voltages on data lines DL1 and DL2. For example, a very high voltage can be applied to DL1 and a very low voltage can be applied to DL2. This would result in pull-down transistors T2 and T6 being turned OFF and result in the voltage on the match line 138 to remain high, thereby indicating a match regardless of the value or range of values stored in the aCAM cell 130. In various embodiments, the aCAM cell 130 may be configured to indicate a mismatch for a stored word by tuning the conductance $G_{M1}$ of memristor M1 and the conductance $G_{M2}$ of memristor M2 such that $f(G_{M1}) > f(G_{M2})$. The aCAM cell 130 would produce a mismatch, and in some cases resulting in a mismatch for a stored word, regardless of the search input value received at the aCAM cell 130.

In various embodiments, the aCAM cell 130 can also be configured to store discrete values. Storing a discrete value in the aCAM cell 130 can be based on voltage quantization. Voltages that are within a preconfigured range of a given voltage may be defined as being equivalent to the given voltage. For example, voltages that are within 0.4 of 0.1 may be defined as 0.1. In this manner, a discrete value that is searched (e.g., a discrete voltage applied to the data line 142) may return a match as long as it falls within a range predefined to be equivalent to the searched value, thereby providing a degree of noise tolerance.

In an aCAM, several cells can be connected to the match line 138. The match line 138 outputs high when each cell on the match line 138 matches its corresponding search input value. In contrast to digital CAMs, aCAMs can have significantly higher memory density. For example, the aCAM cell 130 can store multiple bits with its six transistors and two memristors. In contrast, an SRAM cell can store a one bit value using ten transistors and a ternary bit value using sixteen transistors (in the case of a digital TCAM cell). Moreover, a single aCAM cell is capable of storing analog ranges of values, thereby allowing the aCAM cell to search and match a wide range of analog inputs, which digital CAMs cannot do.

Figure 1C:
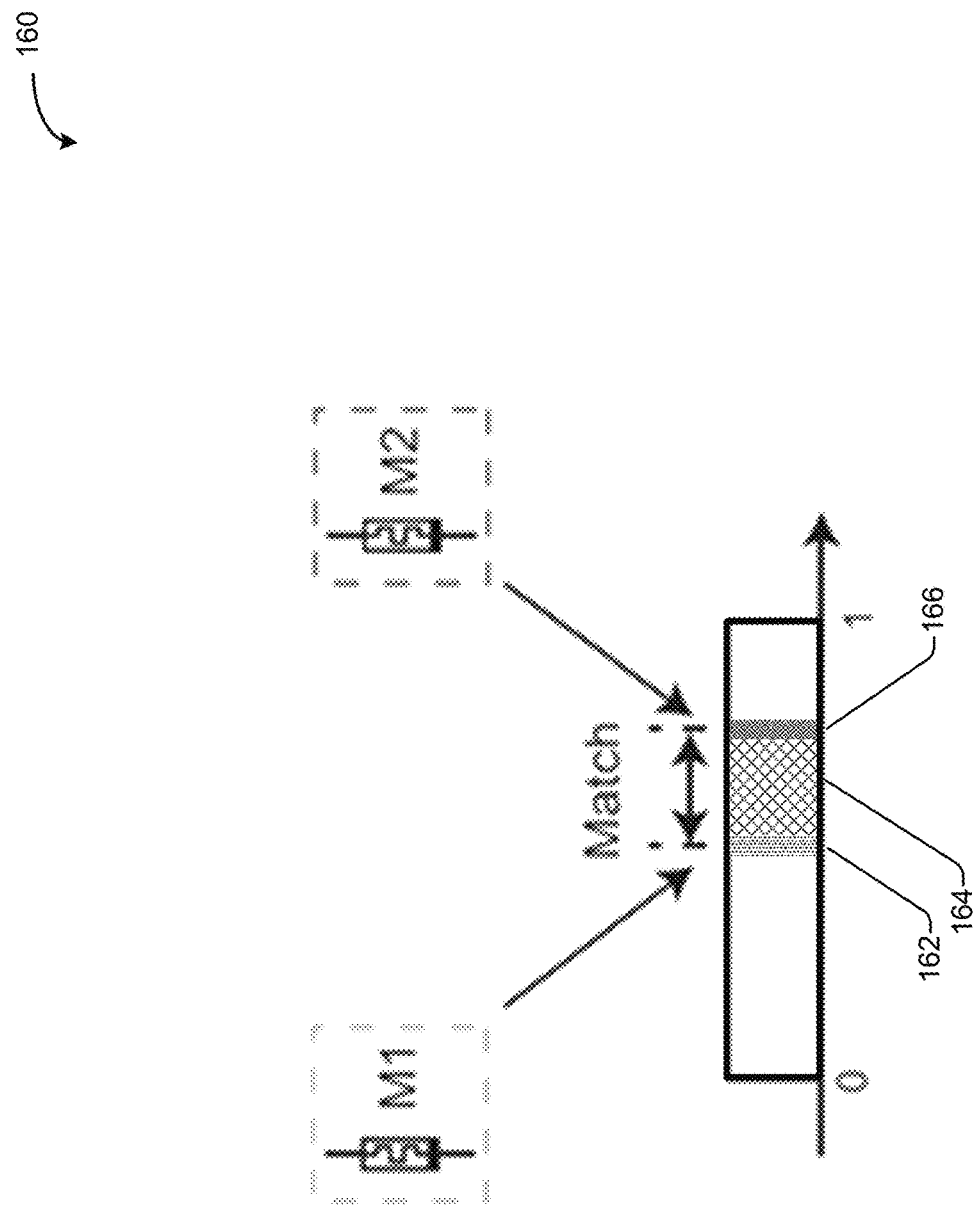
FIG. 1C depicts an example analog range of values that can be stored in an aCAM cell in accordance with various embodiments.

FIG. 1C depicts an example analog range of values 160 that can be stored in an aCAM cell in accordance with various embodiments. As described herein, an aCAM cell may store an analog range of values by tuning a conductance GM1 of a memristor M1 and a conductance GM2 of a memristor M2 to obtain an analog voltage range defined by a lower voltage bound f (GM1) and an upper voltage bound f (GM2). For example, a search input value can be compared against the analog range of values 160 stored in the aCAM cell. This comparison can involve determining whether a data line voltage VDL corresponding to the search input value is within the analog voltage range 160 defined by the lower voltage bound f (GM1) and the upper voltage bound f (GM2) based on whether a match line to which the aCAM cell is connected remains at a high voltage (a high logic level) or is discharged to a low voltage (a low logic level). As illustrated in FIG. 1C, a fuzzy search capability may be provided, whereby the aCAM cell may search an input range of values against a stored range of values and output a match even if the search input range does not strictly correspond to the stored range. In various embodiments, the aCAM cell may provide a fuzzy search capability that expands a matching range for the aCAM cell beyond the stored range 164 to include fuzzy match ranges 162, 166. If an input search range of values does not exactly fall within the stored range 164, the aCAM cell may nonetheless output a match if the input search range falls within the matching range that includes the fuzzy match ranges 162, 166. One or both of the fuzzy match ranges 162, 166 may be appended to one or both ends of the stored range 164 to produce the matching range. In various embodiments, the fuzzy match ranges 162, 164 may be captured by the lower voltage bound $f(G_{M1})$ and the upper voltage bound $f(G_{M2})$ of the analog voltage range.

Figure 2A:
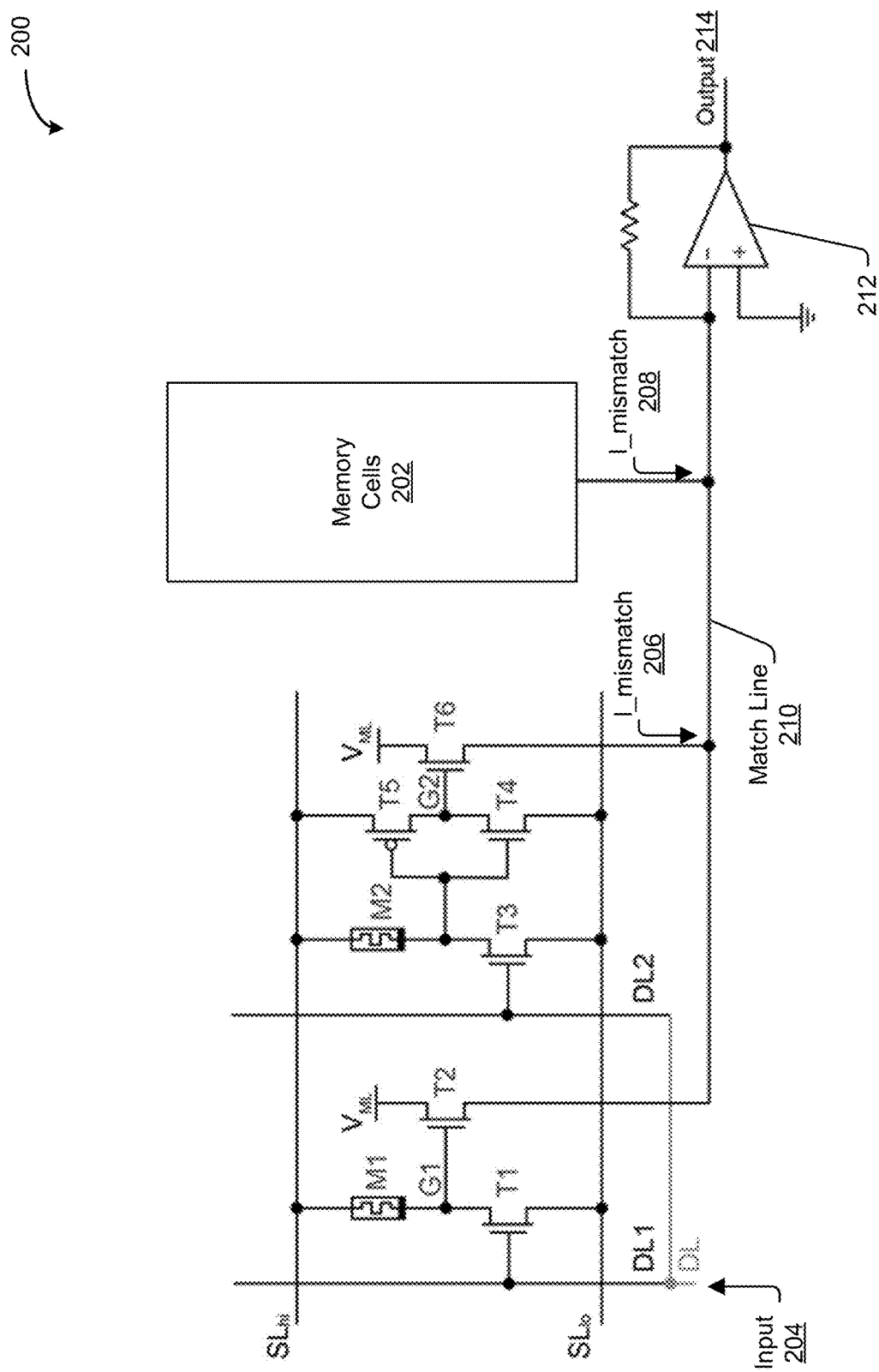
FIG. 2A is a diagram of an example aCAM cell configured to provide an analog output in accordance with various embodiments.

FIG. 2A is a diagram of an example aCAM cell 200 configured to provide an analog output in accordance with various embodiments. As illustrated in FIG. 2A, the aCAM cell 200 includes six transistors (T1-T6) and two memristors (M1-M2). The aCAM cell 200 can be implemented, for example, as the aCAM cell 130 of FIG. 1B. In various embodiments, the aCAM cell 200 can receive an input 204 through a data line. The input 204 can be compared with an upper bound value and a lower bound value corresponding to a conductance of the memristor M1 and a conductance of the memristor M2. If the input 204 is within a range of values established by the upper bound value and the lower bound value, the aCAM cell 200 provides a zero (or very small) mismatch current, which can produce a zero (or close to zero) output voltage 214. (e.g., indicating a match). If the input 204 is outside the range of values established by the upper bound value and the lower bound value, the aCAM cell 200 contributes a portion of mismatch current 206 to the match line 210, which can produce an output voltage 214 (e.g., indicating a mismatch). In various embodiments, the match line 210 is kept virtually grounded and the voltage on the match line 210 is kept zero. If the input 204 is outside the range of values stored in the aCAM cell 200, the aCAM cell 200 increases the i_mismatch 206 current on the match line 210. If the input 204 is within the range of values stored in the aCAM cell 200, the aCAM cell 200 does not increase the i_mismatch 206 current on the match line 210. As illustrated in FIG. 2A, the aCAM cell 200 can be on the match line 210 with other memory cells 202. The other memory cells 202 and the aCAM cell 200 can contribute to a total i_mismatch 208 current on the match line 210 based on whether inputs to the other memory cells 202 and the input 204 to the aCAM cell 200 match stored values in the other memory cells 202 and the aCAM cell 200. The total i_mismatch 208 current on the match line 210 indicates a total number of mismatches on the match line 210. As illustrated in FIG. 2A, the total i_mismatch 208 current can be provided to a voltage converter 212 (e.g., operational amplifier). The voltage converter 212 can generate a voltage output 214 corresponding to the total number of mismatches on the match line 210 based on the total i_mismatch 208 current. For example, a match line of an aCAM can have five aCAM cells on the match line. The input search word can have two matches and three mismatches with the stored values in the five aCAM cells on the match line. In this example, the three aCAM cells associated with the three mismatches each increase a current on the match line. The two aCAM cells associated with the two matches do not increase the current on the match line. The resulting current on the match line indicates that there were three mismatches (and two matches) with the input search word. An output voltage can be generated based on the resulting current. The output voltage can indicate that there were three mismatches (and two matches) with the input search word. Thus, by providing an analog output, an aCAM as described herein can provide an indication of a match between an input search word and a stored word and an indication of a degree to which the input search word and the stored word match.

In various embodiments, a range of voltage outputs generated by the voltage converter 212 can correspond with a range of possible mismatches between an input search word and a stored word. In some cases, the range of voltage outputs can be limited by a threshold voltage. The threshold voltage can be associated with a threshold number of mismatches that can be tolerated between an input search word and a stored word. An input search word that has a number of mismatches with a stored word that exceeds the threshold number of mismatches can result in a voltage output corresponding with the threshold voltage. The voltage output corresponding with the threshold voltage can indicate that the input search word and the stored word are a mismatch. An input search word that has a number of mismatches with a stored word that within the threshold number of mismatches can result in a voltage output in a voltage range within the threshold voltage. The voltage range can indicate a number of mismatches within the threshold number of mismatches between the input search word and the stored word. In various applications, such as fuzzy logic applications, an input search word can be considered to match a stored word even where a number of mismatches between the input search word and the stored word is below a threshold number of mismatches. Among the input search words that satisfy the threshold number of mismatches, the input search words can be ranked based on the degrees to which the input search words matched the stored word. In this way, input search words can be ranked based on their Hamming distances. An input search word that has fewer mismatches with a stored word than an input search word that has more mismatches with the stored word can be ranked higher. An input search word that has more mismatches with a stored word than an input search word that has fewer mismatches with the stored word can be ranked lower.

Figure 2B:
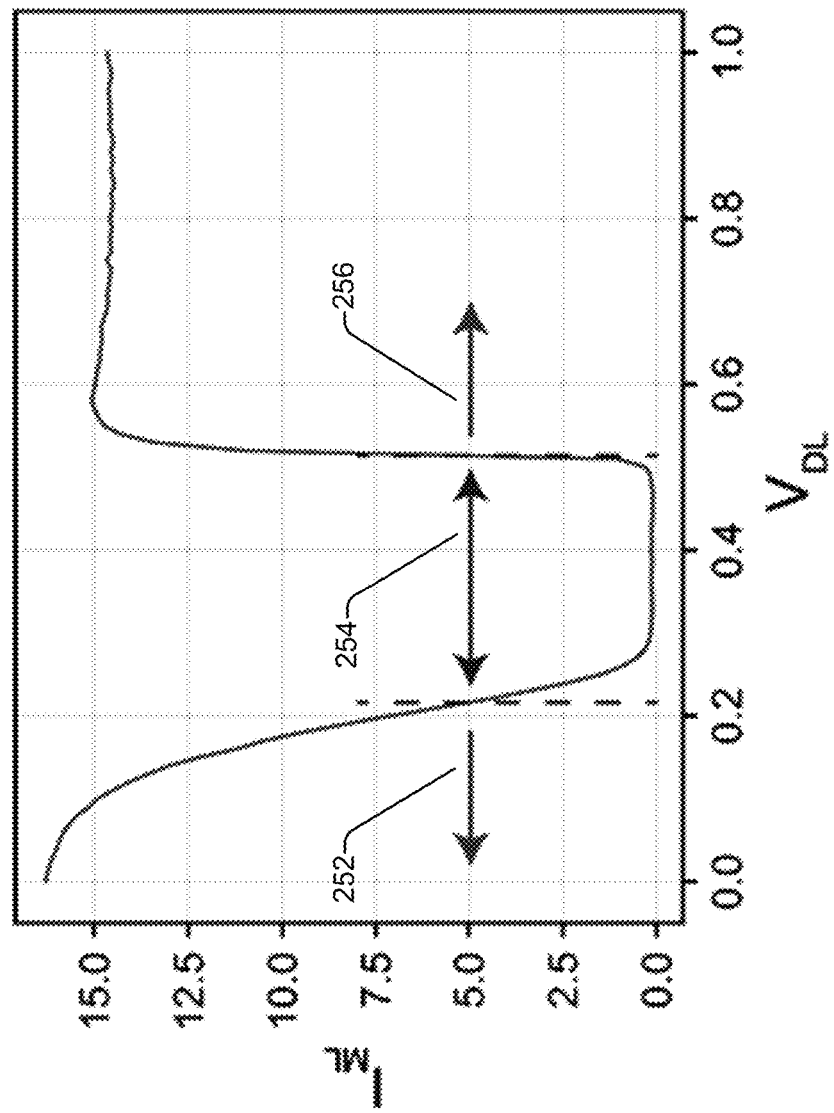
FIG. 2B illustrates an example graph depicting a relationship between current on a match line ($I_{ML}$) and voltage on a data line ($V_D$) in accordance with various embodiments.

FIG. 2B illustrates an example graph 250 depicting a relationship between current on a match line ($I_{ML}$) and voltage on a data line ($V_{DL}$) in accordance with various embodiments. As described herein, a match line is charged to a high voltage to perform a search. The match line is discharged by aCAM cells on the match line based on whether an input search value matches a stored value. As illustrated in FIG. 2B, the example graph 250 can be associated with an aCAM cell that stores a range of values corresponding with a voltage range from 0.2V to 0.5V. Thus, the aCAM cell has a match range 254 from 0.2V to 0.5V. The aCAM cell has a mismatch range 252 for voltages below 0.2V and a mismatch range 256 for voltages above 0.5V. An input value that is within the match range 254 does not cause the aCAM to discharge the match line and does not cause the aCAM to increase current on the match line. An input value that is within the mismatch ranges 252, 256 causes the aCAM to discharge the match line and causes the aCAM to increase current (e.g., 15 µA) on the match line. The examples and the values provided herein are for illustrative purposes, and it should be understood that many variations are possible.

Figure 3A:
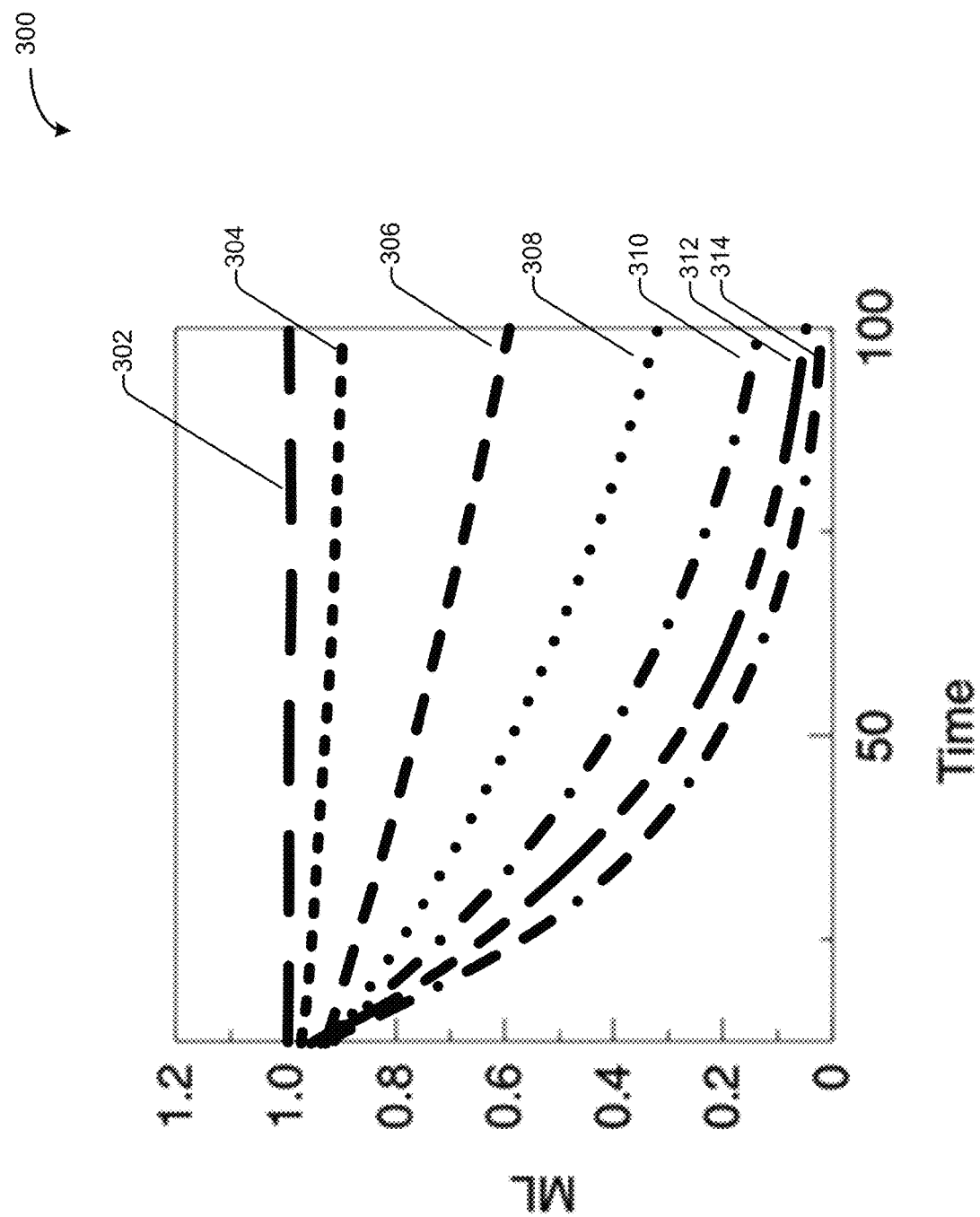
FIG. 3A illustrates an example graph depicting a relationship between voltage on a match line ($V_{ML}$) and time in accordance with various embodiments.

FIG. 3A illustrates an example graph 300 depicting a relationship between voltage on a match line ($V_{ML}$) and time in accordance with various embodiments. In various embodiments, the relationship depicted in the example graph 300 can be a basis for determining a number of mismatches between an input search word and a stored word based on the voltage on the match line over time. As described herein, a match line is charged to a high voltage to perform a search. The match line is discharged by aCAM cells on the match line based on whether an input search value matches a stored value. As illustrated in FIG. 3A, the voltage on the match line decays over time, and the rate at which the voltage on the match line decays corresponds with a number of mismatches between an input search word and a stored word. In the example graph 300, a graph line 302 depicts voltage on a match line over time for zero mismatches. A graph line 304 depicts voltage on a match line over time for one mismatch. A graph line 306 depicts voltage on a match line over time for two mismatches. A graph line 308 depicts voltage on a match line over time for three mismatches. A graph line 310 depicts voltage on a match line over time for four mismatches. A graph line 312 depicts voltage on a match line over time for five mismatches. A graph line 314 depicts voltage on a match line over time for six mismatches. In various embodiments, a number of mismatches between an input search word and a stored word can be determined based on a voltage on a match line at a given time. A determination of the number of mismatches in this way does not rely on a voltage converter to convert a current on the match line to a voltage that indicates the number of mismatches. For example, based on the example graph 300, it can be determined that, at 50 µs, an input search word that has zero mismatches with a stored word will result in a match line of approximately 1.0 V. An input search word that has one mismatch with a stored word will result in a match line of approximately 0.9 V. An input search word that has two mismatches with a stored word will result in a match line of approximately 0.8 V. An input search word that has three mismatches with a stored word will result in a match line of approximately 0.6 V. An input search word that has more than three mismatches will result in a match line of approximately 0.4 V or less. In this example, three mismatches can be selected as a threshold number of mismatches. An input search word that has three mismatches with a stored word can be considered a match based on the threshold number of mismatches. When a search is performed for an input search word, the match line can be evaluated at 50 µs. If the match line has 0.6V or more, then a match for the input search word can be determined based on the voltage of the match line. A number of mismatches can be determined based on the voltage of the match line at 50 µs. Thus, by evaluating a voltage of a match line at a selected time, a number of mismatches between an input search word and a stored word can be determined. The examples and the values provided herein are for illustrative purposes, and it should be understood that many variations are possible.

Figure 3B:
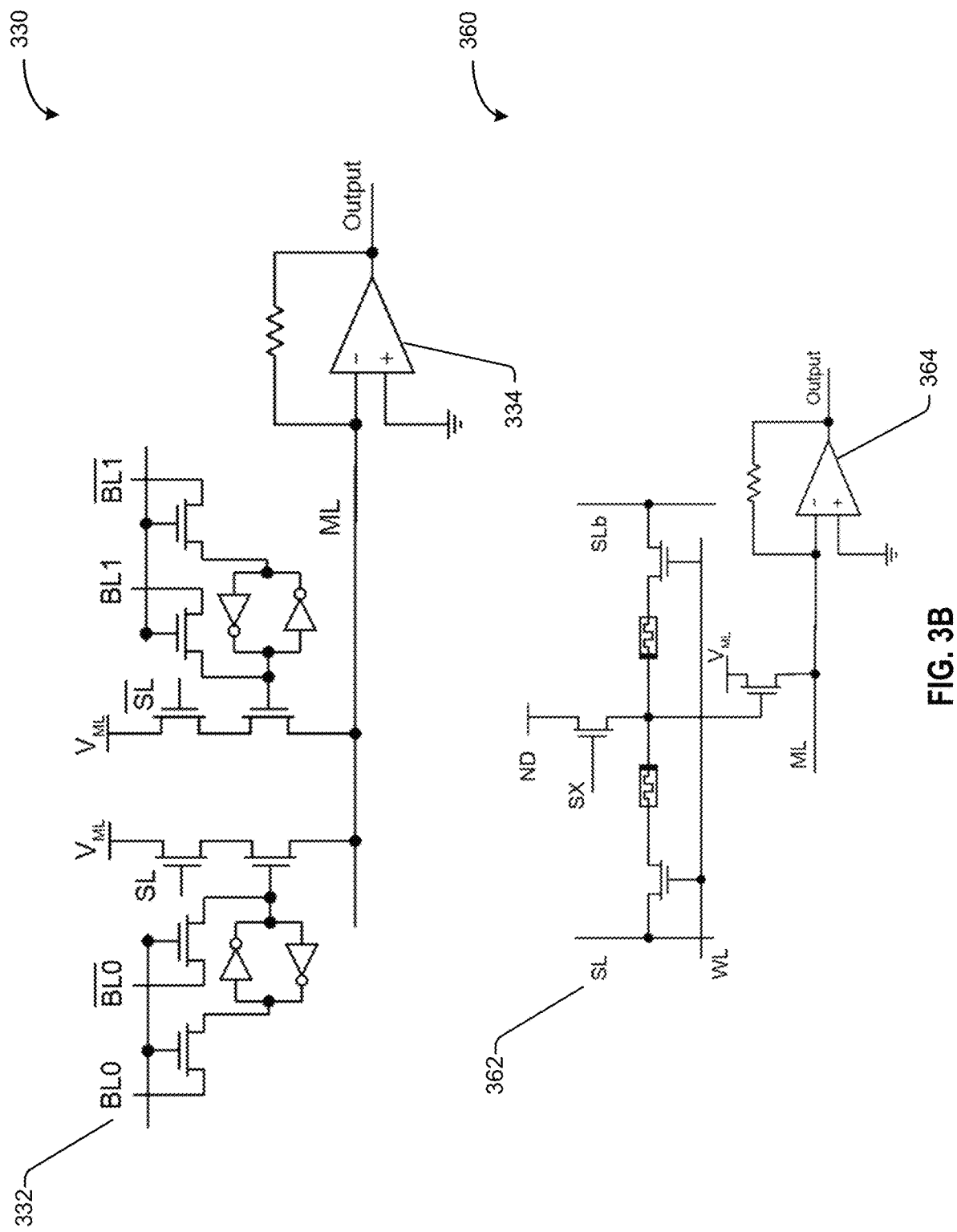
FIG. 3B illustrates example implementations of CAMs with analog outputs in accordance with various embodiments.

FIG. 3B illustrates example implementations 330, 360 of CAMs with analog outputs in accordance with various embodiments. In the example implementation 330, a SRAM-TCAM cell 332 is implemented with an analog output and a voltage converter 334 to generate an analog voltage output. In the example implementation 360, a 4T2M memristor TCAM cell 362 is implemented with an analog output and a voltage converter 364 to generate an analog voltage output. As illustrated in FIG. 3B, the various embodiments described herein are not restricted to the illustrated example architectures or configurations. Desired features can be implemented using a variety of alternative architectures and configurations.

Figure 4:
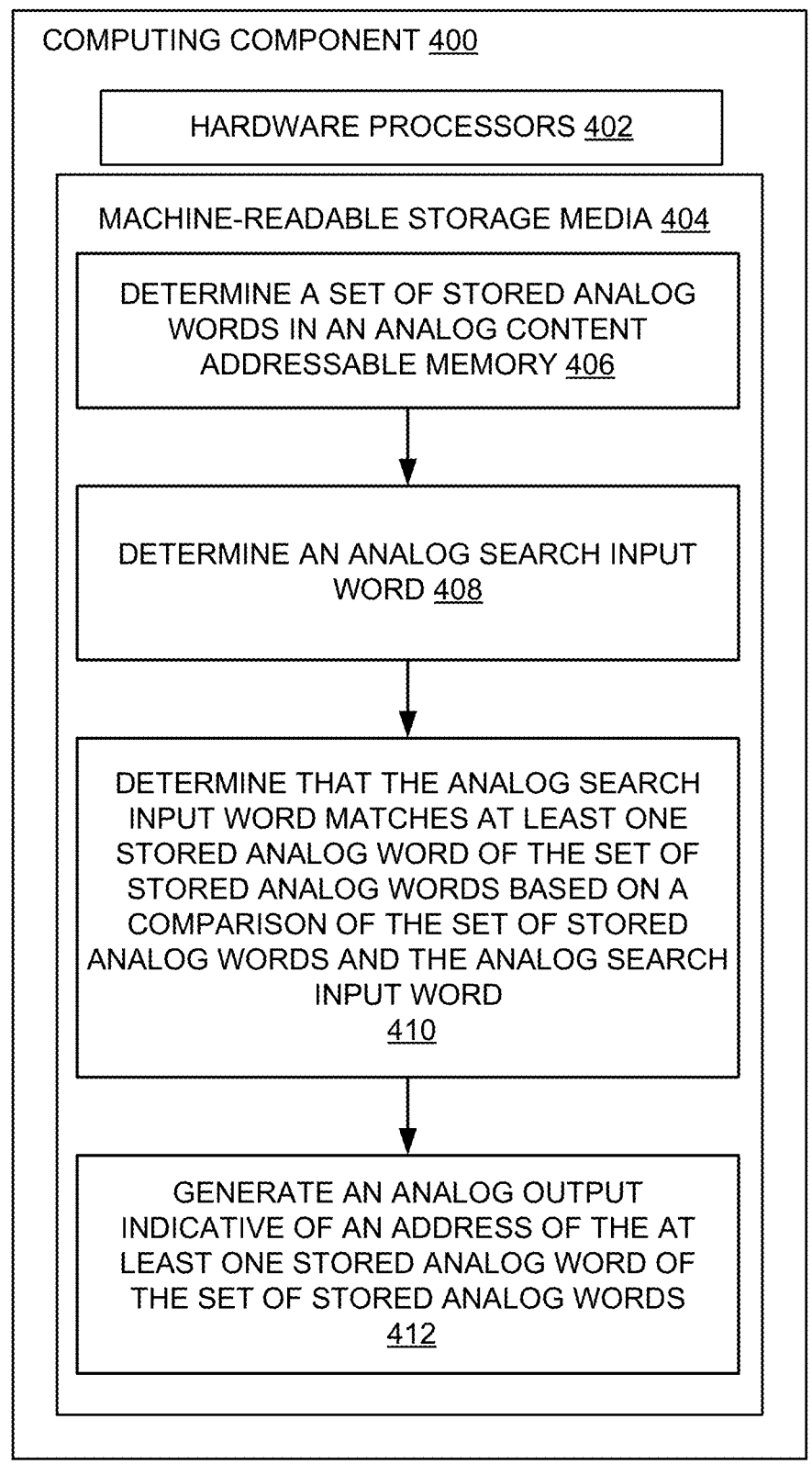
FIG. 4 is a block diagram of an example computing component or device 400 for searching analog ranges of values and generating analog outputs that quantify matches between input data and stored data in accordance with various embodiments.

FIG. 4 is a block diagram of an example computing component or device 400 for searching analog ranges of values and generating analog outputs that quantify matches between input data and stored data in accordance with various embodiments. Computing component 400 may be, for example, a server computer, a client device, a controller, or any other similar computing component capable of processing data. In some cases, various functions performed by the computing component 400 can rely on an aCAM as described herein. It should be understood that many variations are possible. In the example implementation of FIG. 4, the computing component 400 includes a hardware processor, 402, and machine-readable storage medium, 404.

Hardware processor 402 may be one or more central processing units (CPUs), semiconductor-based microprocessors, and/or other hardware devices suitable for retrieval and execution of instructions stored in machine-readable storage medium, 404. Hardware processor 402 may fetch, decode, and execute instructions, such as instructions 406-412, to control processes or operations for searching analog ranges of values and generating analog outputs that quantify matches between input data and stored data. As an alternative or in addition to retrieving and executing instructions, hardware processor 402 may include one or more electronic circuits that include electronic components for performing the functionality of one or more instructions, such as a field programmable gate array (FPGA), application specific integrated circuit (ASIC), or other electronic circuits. Instructions 406-412 can allow for searching analog ranges of values and generating analog outputs that quantify matches between input data and stored data. Although instructions 406-412 are shown, it can be understood that the instructions can be performed in any order, without some of the instructions shown, and/or with the inclusion of other instructions not shown, and the instructions would still fall within the scope of the disclosure.

A machine-readable storage medium, such as machine-readable storage medium 404, may be any electronic, magnetic, optical, or other physical storage device that contains or stores executable instructions. Thus, machine-readable storage medium 404 may be, for example, Random Access Memory (RAM), non-volatile RAM (NVRAM), an Electrically Erasable Programmable Read-Only Memory (EEPROM), a storage device, an optical disc, and the like. In some embodiments, machine-readable storage medium 404 may be a non-transitory storage medium, where the term "non-transitory" does not encompass transitory propagating signals. As described in detail below, machine-readable storage medium 404 may be encoded with executable instructions, for example, instructions 406-412, for searching analog ranges of values and generating analog outputs that quantify matches between input data and stored data.

At block 406, the hardware processor(s) 402 may execute machine-readable/machine-executable instructions stored in the machine-readable storage media 404 to determine a set of stored analog words in an analog content addressable memory (aCAM). In various embodiments, the set of stored analog words can be associated with a set of stored ranges of analog values.

At block 408, the hardware processor(s) 402 may execute machine-readable/machine-executable instructions stored in the machine-readable storage media 404 to determine an analog search input word. In various embodiments, the analog search input word can include one or more analog search input values.

At block 410, the hardware processor(s) 402 may execute machine-readable/machine-executable instructions stored in the machine-readable storage media 404 to determine that the analog search input word matches at least one stored analog word of the set of stored analog words based on a comparison of the set of stored analog words and the analog search input word. In various embodiments, the set of stored analog words can be associated with a set of stored ranges of analog values. Determining that the analog search input word matches the at least one stored analog word of the set of stored analog words can be based on the set of analog input values being within the set of stored ranges of analog values.

At block 412, the hardware processor(s) 402 may execute machine-readable/machine-executable instructions stored in the machine-readable storage media 404 to generate an analog output indicative of an address of the at least one stored analog word of the set of stored analog words. In various embodiments, the analog output can indicate a number of matches or a number mismatches between the analog input values of an analog search input word and stored analog values of a stored analog word. For example, the analog output can indicate a Hamming distance between the analog input word and the stored analog word.

Figure 5:
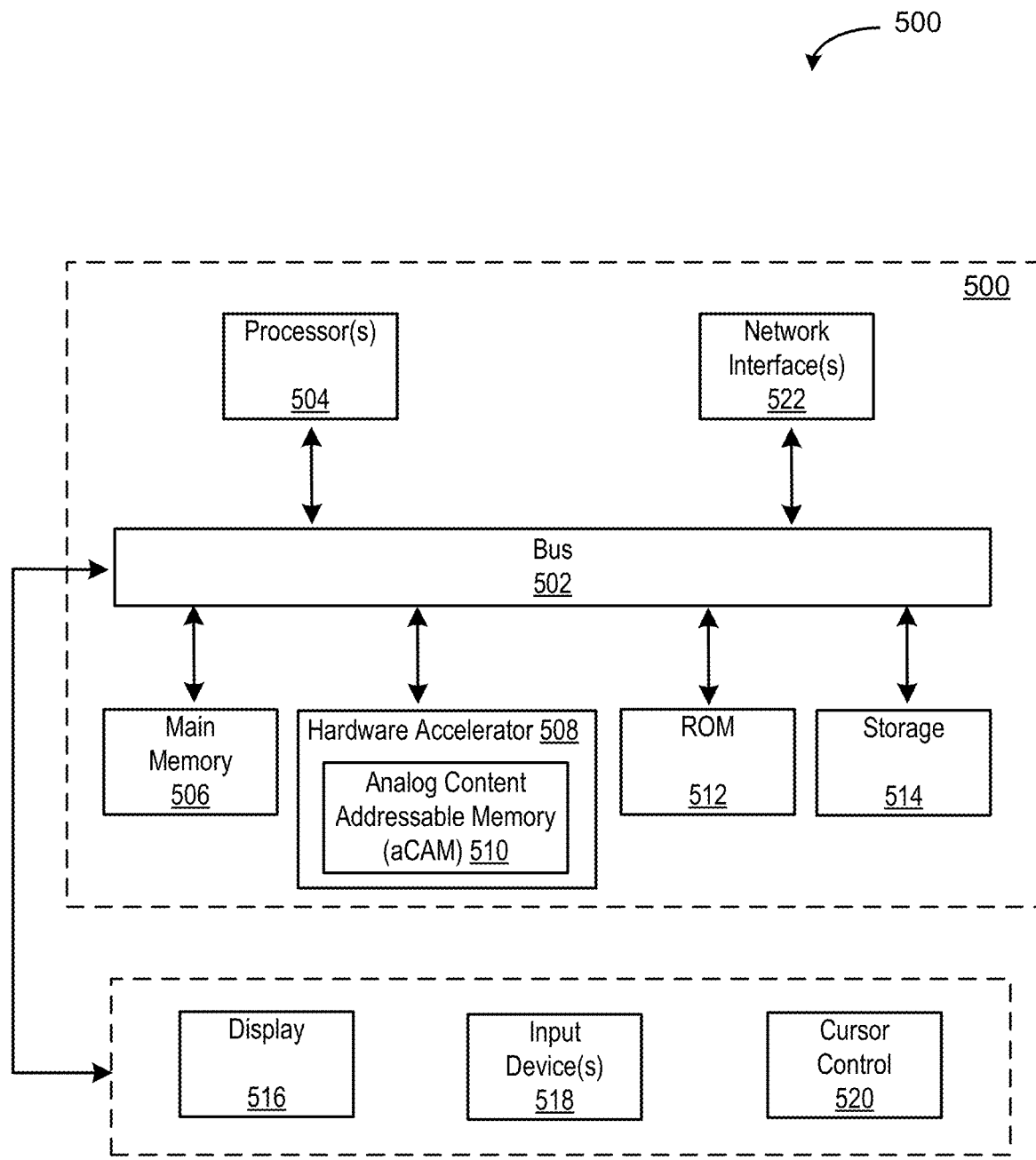
FIG. 5 is an example computing component that may be used to implement various features of embodiments described in the present disclosure.

FIG. 5 depicts a block diagram of an example computer system 500 in which various of the embodiments described herein may be implemented. The computer system 500 includes a bus 502 or other communication mechanism for communicating information, one or more hardware processors 504 coupled with bus 502 for processing information. Hardware processor(s) 504 may be, for example, one or more general purpose microprocessors.

The computer system 500 also includes a main memory 506, such as a random access memory (RAM), cache and/or other dynamic storage devices, coupled to bus 502 for storing information and instructions to be executed by processor 504. Main memory 506 also may be used for storing temporary variables or other intermediate information during execution of instructions to be executed by processor 504. Such instructions, when stored in storage media accessible to processor 504, render computer system 500 into a special-purpose machine that is customized to perform the operations specified in the instructions.

The computer system 500 also includes a hardware accelerator 508. The hardware accelerator 508 may be configured to execute instructions (e.g., programming or software code) stored in the main memory 506, read-only memory (ROM), and/or storage 514 to be performed in combination or in parallel with one or more analog content addressable memory (aCAM) 510. In an example implementation, the exemplary hardware accelerator 508 may include multiple integrated circuits, which in turn, can include Application-Specific Integrated Circuits (ASICs), Field Programmable Gate Arrays (FPGAs) or other Very Large Scale Integrated circuits (VLSIs). The integrated circuits of the exemplary hardware accelerator 508 may be specifically optimized to perform a discrete subset of computer processing operations, or execute a discrete subset of computer-executable instructions, in an accelerated manner. For example, hardware accelerator 508 may be configured or manufactured to implement a set of instructions on the aCAM 510.

The aCAM 510 may include a non-volatile memory built using technologies that include for instance, resistive switching memory (i.e. memristor), phase change memory, magneto-resistive memory, ferroelectric memory, some other resistive random access memory device (Re-RAM), or combinations of those technologies. The aCAM 510 may be implemented using technologies that permit the aCAM 510 to hold its contents even when power is lost or otherwise removed. Thus, data in the aCAM 510 "persists" and the aCAM 510 can act as what is known as a "non-volatile memory."

The computer system 500 further includes a read only memory (ROM) 512 or other static storage device coupled to bus 502 for storing static information and instructions for processor 504. A storage device 514, such as a magnetic disk, optical disk, or USB thumb drive (Flash drive), etc., is provided and coupled to bus 502 for storing information and instructions.

The computer system 500 may be coupled via bus 502 to a display 516, such as a liquid crystal display (LCD) (or touch screen), for displaying information to a computer user. An input device 518, including alphanumeric and other keys, is coupled to bus 502 for communicating information and command selections to processor 504. Another type of user input device is cursor control 520, such as a mouse, a trackball, or cursor direction keys for communicating direction information and command selections to processor 504 and for controlling cursor movement on display 516. In some embodiments, the same direction information and command selections as cursor control may be implemented via receiving touches on a touch screen without a cursor.

The computing system 500 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor(s) 504 executing one or more sequences of one or more instructions contained in main memory 506. Such instructions may be read into main memory 506 from another storage medium, such as storage device 514. Execution of the sequences of instructions contained in main memory 506 causes processor(s) 504 to perform the process steps described herein. In alternative embodiments, hardwired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 514. Volatile media includes dynamic memory, such as main memory XYZ06. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 502. Transmission media can also take the form of acoustic or light waves, such as those generated during radio-wave and infra-red data communications.

The computer system 500 also includes a communication interface 522 coupled to bus 502. Network interface 522 provides a two-way data communication coupling to one or more network links that are connected to one or more local networks. For example, communication interface 522 may be an integrated services digital network (ISDN) card, cable modem, satellite modem, or a modem to provide a data communication connection to a corresponding type of telephone line. As another example, network interface 522 may be a local area network (LAN) card to provide a data communication connection to a compatible LAN (or WAN component to communicated with a WAN). Wireless links may also be implemented. In any such implementation, network interface 522 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 522, which carry the digital data to and from computer system 500, are example forms of transmission media.

The computer system 500 can send messages and receive data, including program code, through the network(s), network link and communication interface 522. In the Internet example, a server might transmit a requested code for an application program through the Internet, the ISP, the local network and the communication interface 522.

The received code may be executed by processor 504 as it is received, and/or stored in storage device XYZ10, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 500.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method comprising:
generating a match line voltage in an analog content addressable memory (aCAM) that decays over time;
evaluating the match line voltage at a selected time;
determining a non-zero number of mismatches between values of an analog search input word and values of a stored analog word in the aCAM based on the match line voltage at the selected time;
determining the analog search input word matches the stored analog word based on the non-zero number of mismatches between the values of the stored analog word and the values of the analog search input word; and
generating an analog output indicative of an address of the stored analog word and the non-zero number of mismatches between the values of the analog search input word and the values of the stored analog word;
wherein:
the values of the stored analog word correspond with a set of stored voltage ranges,
the values of the analog search input word correspond with a set of input voltages, each input voltage of the set of input voltages being compared to one stored voltage range of the set of stored voltage ranges, and
a mismatch between a value of the analog search input word and a value of the stored analog word occurs when an input voltage corresponding with the value of the analog search input word is outside a stored voltage range corresponding with the value of the stored analog word, wherein an upper bound voltage of the stored voltage range is associated with a first conductance of a first memristor of the aCAM and a lower bound voltage of the stored voltage range is associated with a second conductance of a second memristor of the aCAM.

2. The method of claim 1, wherein the analog output is further indicative of a Hamming distance between the analog search input word and the stored analog word.

3. The method of claim 1, wherein determining that the analog search input word matches the stored analog word is based on the non-zero number of mismatches between the values of the analog search input word and the values of the stored analog word being within a threshold number of mismatches.

4. The method of claim 1, wherein a stored voltage range in the set of stored voltage ranges is associated with a fuzzy match range, wherein the fuzzy match range extends a matching range of the stored voltage range.

5. The method of claim 1, wherein a rate at which the match line voltage decays corresponds with the number of mismatches between the values of the analog search input word and the values of the stored analog word.

6. The method of claim 5, wherein the rate at which the match line voltage decays increases with an increasing number of number of mismatches.

7. An analog content addressable memory (aCAM) configured to perform:
generate a match line voltage in the aCAM that decays over time;
evaluate the match line voltage at a selected time; and
determine a non-zero number of mismatches between values of an analog search input word and values of a stored analog word in the aCAM based on the match line voltage at the selected time;
determine the analog search input word matches a stored analog word in the aCAM based on a non-zero number of mismatches between values of the stored analog word and values of the analog search input word; and
generate an analog output indicative of an address of the stored analog word and the non-zero number of mismatches between the values of the analog search input word and the values of the stored analog word;
wherein:
the values of the stored analog word correspond with a set of stored voltage ranges,
the values of the analog search input word correspond with a set of input voltages, each input voltage of the set of input voltages being compared to one stored voltage range of the set of stored voltage ranges, and
a mismatch between a value of the analog search input word and a value of the stored analog word occurs when an input voltage corresponding with the value of the analog search input word is outside a stored voltage range corresponding with the value of the stored analog word, wherein an upper bound voltage of the stored voltage range is associated with a first conductance of a first memristor of the aCAM and a lower bound voltage of the stored voltage range is associated with a second conductance of a second memristor of the aCAM.

8. The aCAM of claim 7, wherein the analog output is further indicative of a Hamming distance between the analog search input word and the stored analog word.

9. The aCAM of claim 7, wherein determining that the analog search input word matches the stored analog word is based on the non-zero number of mismatches between the values of the analog search input word and the values of the stored analog word being within a threshold number of mismatches.

10. The aCAM of claim 7, wherein a stored voltage range in the set of stored voltage ranges is associated with a fuzzy match range, wherein the fuzzy match range extends a matching range of the stored voltage range.

11. The aCAM of claim 7, wherein a rate at which the match line voltage decays corresponds with the number of mismatches between the values of the analog search input word and the values of the stored analog word.

12. The aCAM of claim 11, wherein the rate at which the match line voltage decays increases with an increasing number of number of mismatches.

13. A system comprising:
a processor configured to execute machine-executable instructions to:
generate a match line voltage in an analog content addressable memory (aCAM) that decays over time;
evaluate the match line voltage at a selected time;
determine a non-zero number of mismatches between values of an analog search input word and values of a stored analog word in the aCAM based on the match line voltage at the selected time;
determine the analog search input word matches the stored analog word based on a non-zero number of mismatches between values of the stored analog word and values of the analog search input word; and generate an analog output indicative of an address of the stored analog word and the non-zero number of mismatches between the values of the analog search input word and the values of the stored analog word;

wherein:
the values of the stored analog word correspond with a set of stored voltage ranges,
the values of the analog search input word correspond with a set of input voltages, each input voltage of the set of input voltages being compared to one stored voltage range of the set of stored voltage ranges, and
a mismatch between a value of the analog search input word and a value of the stored analog word occurs when an input voltage corresponding with the value of the analog search input word is outside a stored voltage range corresponding with the value of the stored analog word, wherein an upper bound voltage of the stored voltage range is associated with a first conductance of a first memristor of the aCAM and a lower bound voltage of the stored voltage range is associated with a second conductance of a second memristor of the aCAM.

14. The system of claim 13, wherein the analog output is further indicative a Hamming distance between the analog search input word and the stored analog word.

15. The system of claim 13, wherein determining that the analog search input word matches the stored analog word is based on the non-zero number of mismatches between the values of the analog search input word and the values of the stored analog word being within a threshold number of mismatches.

16. The system of claim 13, wherein a rate at which the match line voltage decays corresponds with the number of mismatches between the values of the analog search input word and the values of the stored analog word.

17. The system of claim 16, wherein the rate at which the match line voltage decays increases with an increasing number of number of mismatches.

* * * * *